US009210802B2

(12) United States Patent
Song et al.

(10) Patent No.: US 9,210,802 B2
(45) Date of Patent: Dec. 8, 2015

(54) OPTOELECTRONIC DEVICE PACKAGING METHOD AND CHIP ASSEMBLY HAVING AN ISOLATION DIELECTRIC LOCATED ON BOTH SIDES OF A HIGH-FREQUENCY TRANSMISSION LINE TO FORM A COPLANAR WAVEGUIDE TRANSMISSION LINE

(71) Applicant: Huawei Technologies Co., Ltd., Shenzhen (CN)

(72) Inventors: Xiaolu Song, Shenzhen (CN); Lixian Wang, Shenzhen (CN); Ninghua Zhu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 130 days.

(21) Appl. No.: 14/143,663

(22) Filed: Dec. 30, 2013

(65) Prior Publication Data

US 2014/0110562 A1    Apr. 24, 2014

Related U.S. Application Data

(63) Continuation of application No. PCT/CN2012/083102, filed on Oct. 17, 2012.

(51) Int. Cl.
*H05K 1/02* (2006.01)
*G02B 6/42* (2006.01)

(52) U.S. Cl.
CPC ............. *H05K 1/025* (2013.01); *G02B 6/4279* (2013.01); *H05K 1/0233* (2013.01); *H05K 2201/09727* (2013.01); *H05K 2201/10022* (2013.01); *H05K 2201/10121* (2013.01)

(58) Field of Classification Search
CPC ............. H01L 2224/4813; H01L 2224/85181; G02B 6/4201; G02B 6/4266; G01R 7/02
USPC ....................... 250/551, 239, 221, 214.1, 238; 235/492, 485, 454, 375, 380; 257/659, 257/762, 690; 710/305; 385/8, 9
See application file for complete search history.

(56) References Cited

U.S. PATENT DOCUMENTS

| 6,617,527 | B2 | 9/2003 | Ozeki et al. |
| 6,639,322 | B1 | 10/2003 | Welstand |
| 7,062,114 | B2 | 6/2006 | Webjorn et al. |
| 7,160,039 | B2 | 1/2007 | Hargis et al. |
| 7,550,839 | B2 | 6/2009 | Gasparik et al. |

(Continued)

FOREIGN PATENT DOCUMENTS

| CN | 1347278 A | 5/2002 |
| CN | 1764026 A | 4/2006 |

(Continued)

*Primary Examiner* — Que T Le
(74) *Attorney, Agent, or Firm* — Brinks Gilson & Lione

(57) ABSTRACT

An optoelectronic device includes a packaged part and a core component. The core component includes a chip subcarrier and an optoelectronic chip. The device also includes a connecting plate that forms a coplanar waveguide transmission line together with the ground through a high-frequency transmission line and an isolation dielectric. The coplanar waveguide transmission line and a low-frequency line are connected to the packaged part and the core component and are configured to transmit a high-frequency signal and a low-frequency signal between the packaged part and the core component.

10 Claims, 4 Drawing Sheets

(56) References Cited

U.S. PATENT DOCUMENTS

| | | | |
|---|---|---|---|
| 8,898,365 B2 * | 11/2014 | Masleid et al. | 710/305 |
| 2008/0102692 A1 | 5/2008 | Zaderej et al. | |
| 2008/0115966 A1 | 5/2008 | Sun et al. | |

FOREIGN PATENT DOCUMENTS

| | | |
|---|---|---|
| CN | 1897259 A | 1/2007 |
| CN | 1917311 A | 2/2007 |
| CN | 101174718 A | 5/2008 |

* cited by examiner

OPTOELECTRONIC DEVICE PACKAGING METHOD AND CHIP ASSEMBLY HAVING AN ISOLATION DIELECTRIC LOCATED ON BOTH SIDES OF A HIGH-FREQUENCY TRANSMISSION LINE TO FORM A COPLANAR WAVEGUIDE TRANSMISSION LINE

CROSS-REFERENCE TO RELATED APPLICATIONS

This application is a continuation of International Application No. PCT/CN2012/083102, filed on Oct. 17, 2012, which is hereby incorporated by reference in its entirety.

TECHNICAL FIELD

The application relates to the field of electronic devices, and in particular, to an optoelectronic device.

BACKGROUND

In recent years, as electronic devices continuously develop, optoelectronic devices are increasingly widely used. An optoelectronic device mainly includes a packaged part and a core component. The packaged part receives a high-frequency signal and a low-frequency signal that are transmitted by an external driving circuit of the optoelectronic device, and its surface is mostly formed by a ceramic circuit. The core component includes a chip subcarrier and an optoelectronic chip. The optoelectronic chip is located on the chip subcarrier, and may be a directly modulated laser, a modulator, or a detector.

In the prior art, a wire-bonding is used to connect a high-frequency signal and a low-frequency signal between the packaged part and the core component.

Disadvantages of the prior art are as follows:

In the prior art, a wire-bonding is used to connect a high-frequency signal and a low-frequency signal between a packaged part and a core component, which takes air as a generalized dielectric, so that the high-frequency signal cannot be efficiently transmitted. This affects high-frequency performance of an entire optoelectronic device to a certain extent. In addition, in an existing packaged optoelectronic device, a large number of wire-bondings are needed to connect lines of the packaged part and a chip subcarrier, resulting in poor reliability and operability.

SUMMARY

An optoelectronic device includes:
a packaged part and a core component, where the core component includes a chip subcarrier and an optoelectronic chip; and
a connecting plate, where the connecting plate includes:
a high-frequency transmission line, configured to transmit a high-frequency signal between the packaged part and the core component, where the high-frequency transmission line is a transmission line whose shape tapers from broad to narrow;
an isolation dielectric, located on both sides of the high-frequency transmission line and configured to isolate the high-frequency transmission line and the ground, where the high-frequency transmission line and the isolation dielectric form a coplanar waveguide transmission line together with the ground to implement mode field matching; and
a low-frequency line, configured to transmit a low-frequency signal.

Preferably, the connecting plate is further disposed with:
a backlight detector, configured to detect a working state of the optoelectronic chip by collecting a backlight signal of the optoelectronic chip, so as to perform feedback control.

Preferably, the connecting plate is further disposed with:
a chip matching resistor, configured to implement impedance matching of the optoelectronic chip, and connected to the high-frequency transmission line in series or parallel.

Preferably, the connecting plate is a single-sided connecting plate.

Preferably, the connecting plate is a double-sided connecting plate, where the double-sided connecting plate includes a via for connecting a high-frequency transmission line or the low-frequency line from one side of the connecting plate to the other side; where:
a first side of the connecting plate is connected to the packaged part and the chip subcarrier, and is configured to transmit a high-frequency signal between the packaged part and the chip subcarrier; and
a second side of the connecting plate is connected to the packaged part and the chip subcarrier, and is configured to transmit a low-frequency signal between the packaged part and the chip subcarrier.

Preferably, the first side of the connecting plate includes:
a high-frequency transmission line and an isolation dielectric.

Preferably, the second side of the connecting plate includes:
a backlight detector and a low-frequency line.

Preferably, the first side of the connecting plate is further disposed with:
a chip matching resistor.

Preferably, the chip matching resistor is:
a parallel chip matching resistor, with one end connected to the high-frequency transmission line in parallel through a wire-bonding and the other end connected to the ground, configured to implement impedance matching of the optoelectronic chip when the optoelectronic chip is a high-impedance voltage-type working device; or
a series chip matching resistor, connected to the high-frequency transmission line in series, and configured to implement impedance matching of the optoelectronic chip when the optoelectronic chip is a low-impedance current-type working device.

Preferably, the second side of the connecting plate is further disposed with:
a chip direct current bias inductor, configured to pass direct current and block alternating current, so as to improve power quality of direct current power supply of the optoelectronic chip.

Preferably, the second side of the connecting plate is further disposed with:
a thermistor feeder, configured to detect a feedback voltage of a thermistor; and
a chip thermal tuning circuit, configured to adjust a temperature of the optoelectronic chip into a preset working range according to voltage feedback of the thermistor.

Beneficial effects of the technical solutions provided in the embodiments are as follows:

An optoelectronic device is provided in the embodiments. The optoelectronic device is mainly formed by a packaged part, a core component, and a connecting plate. The connecting plate forms a coplanar waveguide transmission line together with the ground through a high-frequency transmission line and an isolation dielectric. The coplanar waveguide transmission line and a low-frequency line are connected to the packaged part and the core component, and are configured to transmit a high-frequency signal and a low-frequency signal between the packaged part and the core component. A wire-bonding that takes air as a generalized dielectric and is unsuitable for transmission of a high-frequency signal is replaced with the connecting plate, thereby improving integrity and efficiency of a high-frequency signal during transmission of the high-frequency signal and efficiency of transmitting a low-frequency signal. That is, a large number of wire-bondings are replaced by integrating a single connecting plate, thereby improving operability during transmission of a high-frequency signal and a low-frequency signal.

BRIEF DESCRIPTION OF DRAWINGS

To illustrate the technical solutions in the embodiments described below more clearly, the following briefly introduces accompanying drawings required for describing the embodiments. Apparently, the accompanying drawings in the following description are merely exemplary embodiments, and a person of ordinary skill in the art may still derive other drawings according to these accompanying drawings without creative efforts.

DESCRIPTION OF EMBODIMENTS

The following section describes the embodiments of the application in detail with reference to the accompanying drawings.

Embodiment 1

Figure 1:
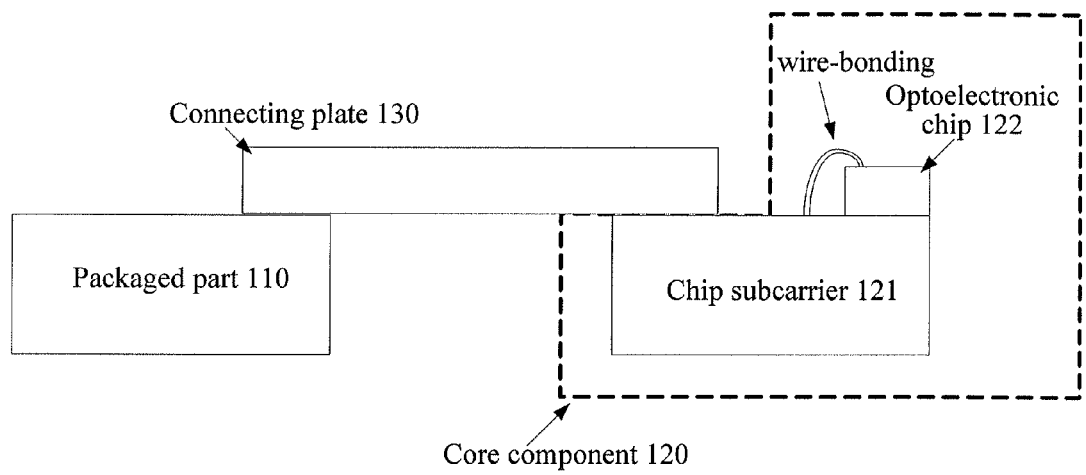
FIG. 1 is a schematic diagram of an optoelectronic device according to Embodiment 1.

As shown in FIG. 1, this embodiment provides an optoelectronic device, including:

A packaged part 110 is configured to transmit a high-frequency signal and a low-frequency signal of a driving circuit, where the low-frequency signal includes a direct current bias electrical signal; the packaged part 110 is connected to an external driving circuit of the optoelectronic device, and transmits a high-frequency signal and a low-frequency signal of the driving circuit through an external flexible printed board of the optoelectronic device; correspondingly, the packaged part 110 is also connected to a core component 120 in the optoelectronic device, and transmits a high-frequency signal and a low-frequency signal through a connecting plate 130. In this embodiment, preferably, a surface of the packaged part 110 is formed by a ceramic circuit.

The core component 120 includes a chip subcarrier 121 and an optoelectronic chip 122, where the optoelectronic chip may be a directly modulated laser, a modulator, or a detector.

The optoelectronic chip 122 is located on the chip subcarrier 121, and is connected to the chip subcarrier 121 through a wire-bonding.

A major function of the preceding high-frequency signal is to modulate an optical signal of the optoelectronic chip 122. Low-frequency signals correspond to different components on a low-frequency line on the connecting plate, and have major functions to supply power to the optoelectronic chip 122, monitor a working state of the optoelectronic chip 122, collect information of a temperature of the optoelectronic chip 122 and control the temperature of the optoelectronic chip 122, and so on.

The connecting plate 130 is connected to the packaged part 110 and the core component 120, and is configured to transmit a high-frequency signal and a low-frequency signal between the packaged part 110 and the core component 120.

Further, in this embodiment, during packaging of the optoelectronic device, a preferable specific connection manner of the connecting plate is to use a inverted welding process to make it face down and then connect it to the packaged part 110 and the chip subcarrier 121 in the core component 120.

The connecting plate 130 includes:

A high-frequency transmission line 131 is configured to transmit a high-frequency signal between the packaged part and the chip subcarrier.

Specifically, in the figure of this embodiment, the high-frequency transmission line 131 is a transmission line whose shape tapers from broad to narrow, and preferably a wedge-shaped tapered transmission line. A wedge-shaped transmission line whose shape tapers from broad to narrow is selected mainly because a left interface of the transmission line that is used to transmit a high-frequency signal for the packaged part 110 generally has a relatively large diameter, while a right interface of the transmission line that is connected to the optoelectronic chip 122 on the chip subcarrier 121 of the core component 120 has a relatively small diameter, which is generally set to 100 mm to 250 mm. Therefore, it is more reasonable to use a wedge-shaped transmission line whose shape tapers from broad to narrow. The wedge-shaped tapered transmission line is only exemplary. There are other cabling manners which may achieve a same transmission effect, such as an exponential tapered transmission line and a trapezoidal transmission line.

An isolation dielectric 132 is located on both sides of the high-frequency transmission line 131, and is configured to isolate the high-frequency transmission line 131 from the ground; in this way, a Ground-Signal-Ground (GSG) structure is formed and a coplanar waveguide transmission line is formed. In this embodiment, the isolation dielectric is preferably implemented by using a groove to isolate the high-frequency transmission line 131 from the ground by using air. Use of aluminum nitride as an isolation material is only exemplary. Other insulating materials, such as aluminum oxide, may also be selected. The insulating material is located at a lower layer of the printed board. Gold is preferably selected as a conductive material at an upper layer of the printed board to form a material between the high-frequency transmission line 131 at the upper layer and the ground; specifically, for implementation, a gold evaporation process may be used after coverage with a mask.

Different from that a wire-bonding transmits a high-frequency signal by taking air as a generalized dielectric, the preceding high-frequency transmission line 131 forms a coplanar waveguide transmission line together with the isolation dielectric 132 and the ground. Its special waveguide structure ensures that mode field matching can be met in a transmission process during transmission of a high-frequency signal.

Further, setting of parameters such as a dielectric thickness of the high-frequency transmission line 131, a dielectric constant of the dielectric, and a dielectric width at various positions ensures impedance matching of the high-frequency transmission line in a high-frequency signal transmission process, so that characteristic impedance of the high-frequency transmission line is distributed constantly, and is generally 50 ohms. The impedance matching of the high-frequency transmission line minimizes reflection of a high-frequency signal in the high-frequency transmission line to a greatest extent, and therefore, integrity of the high-frequency signal is ensured.

In addition, by setting the parameters such as the dielectric thickness of the high-frequency transmission line 131, the dielectric constant of the dielectric, and the dielectric width at various positions, impedance changing of the high-frequency transmission line 131 may also be performed, and impedance of the high-frequency transmission line 131 may also be flexibly changed.

The connecting plate 130 further includes:

A low-frequency line is configured to transmit a low-frequency signal, and corresponds to all circuits in a low-frequency component for transmitting a low-frequency signal, where a reference numeral of the low-frequency line is omitted.

A backlight detector 133 is configured to detect a working state of the optoelectronic chip 122 by detecting a backlight signal of the optoelectronic chip 122, so as to perform feedback control; where space of an electronic component on the chip subcarrier 121 where the backlight detector is originally located is saved.

Specifically, the backlight detector 133 collects the backlight signal of the optoelectronic chip 122, and detects whether a working state, such as lighting, of the current optoelectronic chip 122 is within a preset range; if yes, the monitoring maintained; if no, the backlight detector 133 performs corresponding feedback control, so that the working state of the optoelectronic chip 122 is restored to the preset range.

The connecting plate 130 may further include a chip matching resistor 134, configured to implement impedance matching of the optoelectronic chip 122, so as to eliminate reflection of a high-frequency signal on a load side of the optoelectronic chip 122 as much as possible; where the chip matching resistor 134 may be placed in a line of the connecting plate or a line of the chip subcarrier in parallel or series, and specifically includes:

a parallel chip matching resistor 1341, with one end connected to the high-frequency transmission line through a wire-bonding and the other end connected to the ground, configured to implement impedance matching of the optoelectronic chip when the optoelectronic chip is a high-impedance voltage-type working device; or a series chip matching resistor 1342, connected to the high-frequency transmission line in series, and configured to implement impedance matching of the optoelectronic chip when the optoelectronic chip is a low-impedance current-type working device.

Corresponding to the high-frequency transmission line 131, a value of the chip matching resistor 134 is usually about 50 ohms, and an exact value depends on an actual engineering effect and is not specifically limited.

Beneficial effects of the technical solution provided in this embodiment are as follows:

An optoelectronic device is provided in this embodiment. The optoelectronic device is mainly formed by a packaged part 110, a core component 120, and a connecting plate 130. The connecting plate 130 is connected to the packaged part 110 and the core component 120, and is configured to transmit a high-frequency signal and a low-frequency signal between the packaged part 110 and the core component 120. A wire-bonding that takes air as a generalized dielectric and is unsuitable for transmission of a high-frequency signal is replaced with the connecting plate 130. A high-frequency transmission line 131 and an isolation dielectric 132 form a coplanar waveguide transmission line together with the ground to implement mode field matching and impedance matching, and impedance matching of an optoelectronic chip is implemented through a chip matching resistor 134, thereby improving integrity and efficiency of a high-frequency signal during transmission of the high-frequency signal and efficiency of transmitting a low-frequency signal. A backlight detector 133 is integrated to implement effective control on the optoelectronic chip. A large number of wire-bondings are replaced by integrating a single connecting plate 130 wire-bonding, thereby improving operability during transmission of a high-frequency signal and a low-frequency signal.

Embodiment 2

Figure 2:
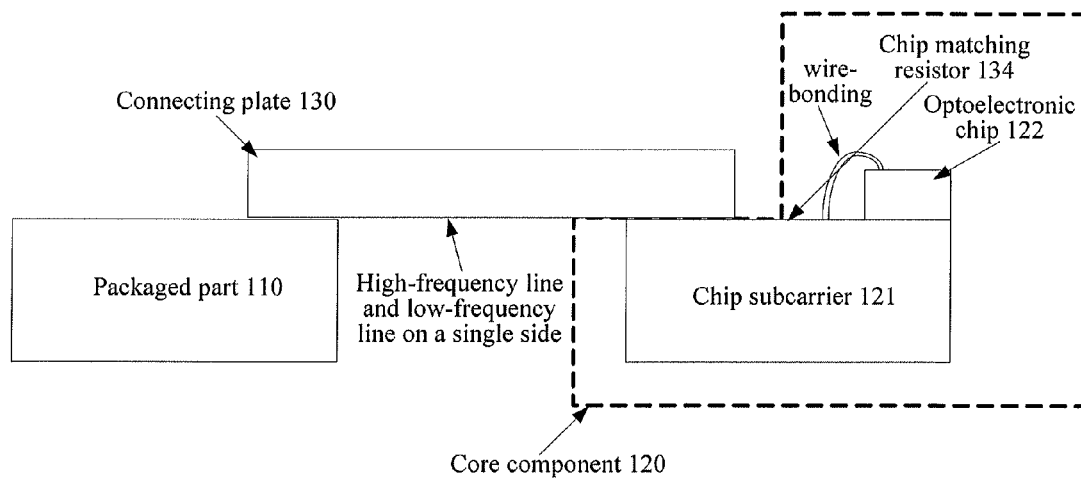
FIG. 2 is a schematic diagram of an optoelectronic device according to Embodiment 3.

As shown in FIG. 2, this embodiment provides an optoelectronic device, including:

a packaged part 110 and a core component 120, where the core component 120 includes a chip subcarrier 121 and an optoelectronic chip 122; and a connecting plate 130, where the connecting plate 130 is connected to the packaged part 110 and the core component 120, and is configured to transmit a high-frequency signal and a low-frequency signal between the packaged part and the core component.

Specifically, in this embodiment, during packaging of the optoelectronic device for the connecting plate 130, a preferable connection manner of the connecting plate is to use a inverted welding process to make it face down and then connect it to the packaged part and the chip subcarrier. In this embodiment, a chip matching resistor 134 is placed on the chip subcarrier 121, and a single-sided connecting plate 130 is preferably used as the connecting plate 130, so as to further simplify a structure of the connecting plate and increase an integration level of the connecting plate.

Figure 3:
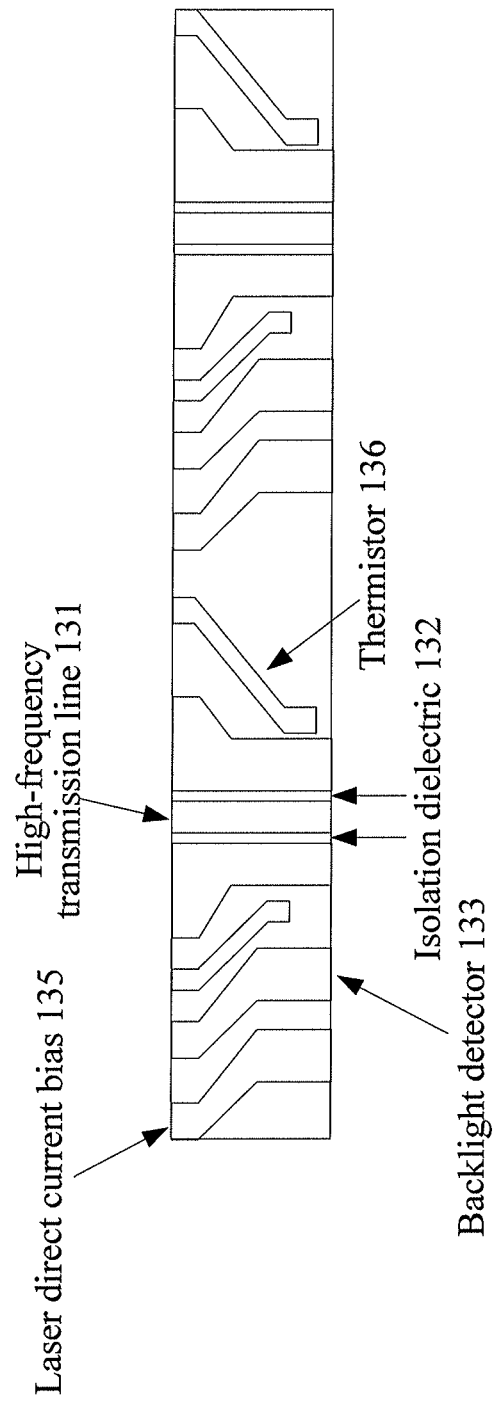
FIG. 3 is a top view of a single-sided connecting plate of an optoelectronic device according to Embodiment 3.

The single-sided connecting plate 130 integrates a high-frequency transmission line for transmitting a high-frequency signal and a low-frequency line for transmitting a low-frequency signal, where a certain distance is kept between the high-frequency transmission line and the low-frequency line, so as to reduce interference. In addition, a case that multiple sets of high-frequency and low-frequency lines may correspond to multiple optoelectronic chips 122 on the chip subcarrier 121 exists. In a top view shown in FIG. 3, there are two sets of high-frequency and low-frequency lines. By taking one set of the two sets of high-frequency and low-frequency lines as an example, the single-sided connecting plate 130 includes:

a high-frequency transmission line 131 and an isolation dielectric 132, where the high-frequency transmission line 131 and the isolation dielectric 132 form a coplanar waveguide transmission line together with the ground;

a low-frequency line, including:

a direct current bias power supply line connected to a direct current positive pole 135 of a laser; and a backlight detector 133 that saves space of an electronic component on the chip subcarrier 121 where the backlight detector is originally located.

The single-sided connecting plate may further include:

a thermistor 136, which is a resistor whose resistance value changes with a temperature, is configured to measure a temperature to obtain a corresponding direct current, and forms a thermistor loop together with the low-frequency line in the single-sided connecting plate to measure a temperature.

Beneficial effects of the technical solution provided in this embodiment are as follows:

An optoelectronic device is provided in this embodiment. The optoelectronic device is mainly formed by a packaged part 110, a core component 120, and a single-sided connecting plate 130, where the single-sided connecting plate 130 highly integrates a high-frequency transmission line and a low-frequency line. A high-frequency transmission line 131 on the single-sided connecting plate forms a coplanar waveguide transmission line together with an isolation dielectric 132 and the ground to ensure mode field matching during a high-frequency signal transmission process. Impedance matching of the high-frequency transmission line 131 is implemented by changing parameters such as a dielectric thickness of the high-frequency transmission line 131, a dielectric constant of the dielectric, and a dielectric width. The preceding mode field matching and impedance matching ensure integrity and efficiency of transmitting a high-frequency signal. A high-frequency response between the optoelectronic chip 122 and the packaged part 110 is improved during a packaging process of the optoelectronic device. The single-sided connecting plate 130 may correspond to multiple optoelectronic chips to pass a low-frequency signal and direct current. In addition, different components such as a backlight detector 133 and a thermistor 136 are integrated, thereby extending corresponding functions.

Embodiment 3

Figure 4:
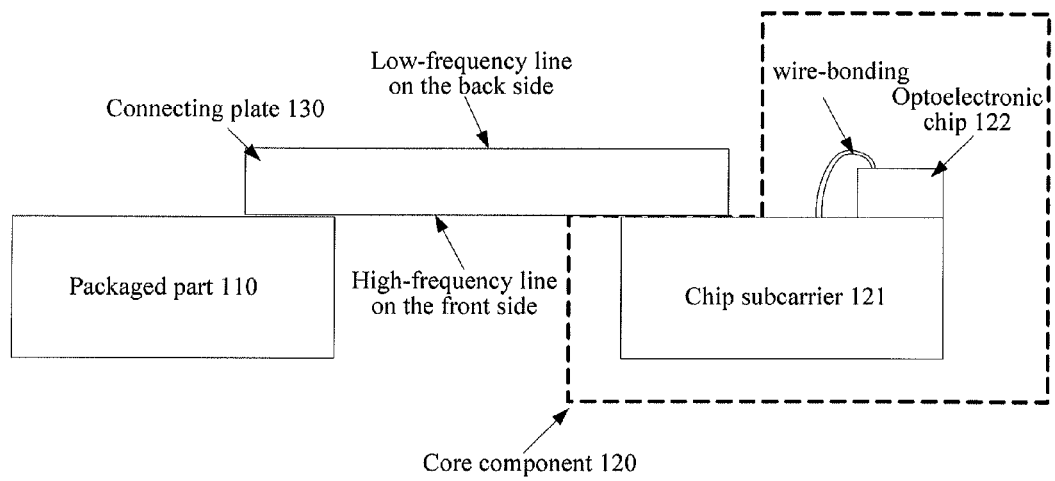
FIG. 4 is a schematic diagram of an optoelectronic device according to Embodiment 3.

As shown in FIG. 4, this embodiment provides an optoelectronic device, including:

a packaged part 110 and a core component 120, where the core component 120 includes a chip subcarrier 121 and an optoelectronic chip 122; and a connecting plate 130, where the connecting plate 130 is connected to the packaged part 110 and the core component 120, and is configured to transmit a high-frequency signal and a low-frequency signal between the packaged part 110 and the core component 120.

Specifically, during packaging of the optoelectronic device, a preferable connection manner of the connecting plate is to use a inverted welding process to make it face down and then connect it to the packaged part 110 and the chip subcarrier 121. In this embodiment, a double-sided connecting plate 130 as shown in the figure is preferably used as the connecting plate 130 to separate a high-frequency transmission line and a low-frequency line and further reduce interference between the high-frequency transmission line and the low-frequency line.

The double-sided connecting plate 130 is connected to the packaged part and the chip subcarrier by using the inverted welding process. A circuit board on a front side facing down of the connecting plate is used as a first side, which preferably transmits a high-frequency signal between the packaged part and the chip subcarrier; a circuit board on a back side facing up of the connecting plate is used as a second side, which transmits a low-frequency signal between the packaged part and the chip subcarrier. On the contrary, it may also be that the preceding first side transmits a low-frequency signal between the packaged part and the chip subcarrier, and the preceding second side transmits a high-frequency signal between the packaged part and the chip subcarrier.

The double-sided connecting plate 130 is provided with a via 137. The via 137 is configured to connect the high-frequency transmission line or the low-frequency line from one side of the connecting plate to the other side. Specifically, in this embodiment, the packaged part 110 and a low-frequency line on the chip subcarrier 121 are connected through the via 137 from the first side of the connecting plate on the front side to the second side of the connecting plate on the back side.

Figure 5:
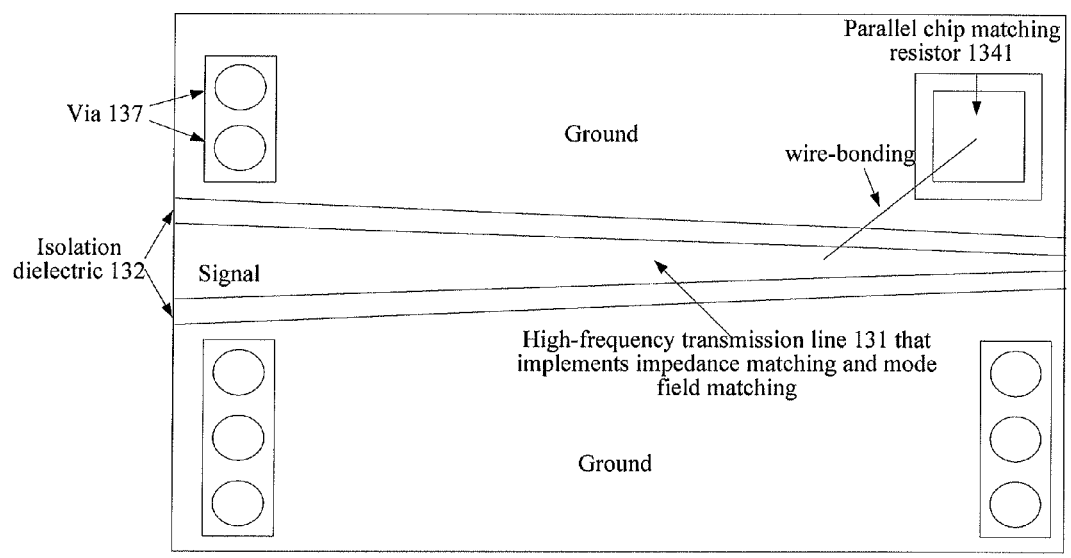
FIG. 5 is a top view of a first side of a connecting plate of an optoelectronic device according to Embodiment 4.

FIG. 5 is a top view of the front side of the connecting plate when the optoelectronic chip 122 is an optoelectronic chip that works at a voltage such as a voltage of an electroabsorption modulated laser. In addition to the preceding via, the first side of the connecting plate includes:

a high-frequency transmission line 131 and an isolation dielectric 132, where the high-frequency transmission line 131 and the isolation dielectric 132 form a coplanar waveguide transmission line together with the ground;

a low-frequency line, connected through the via 137 from the front side to the back side to transmit a low-frequency signal; and a parallel chip matching resistor 1341, with one end connected to the high-frequency transmission line 131 through a wire-bonding and the other end connected to the ground, and configured to implement impedance matching of the optoelectronic chip 122 when the optoelectronic chip 122 works at a voltage.

Figure 6:
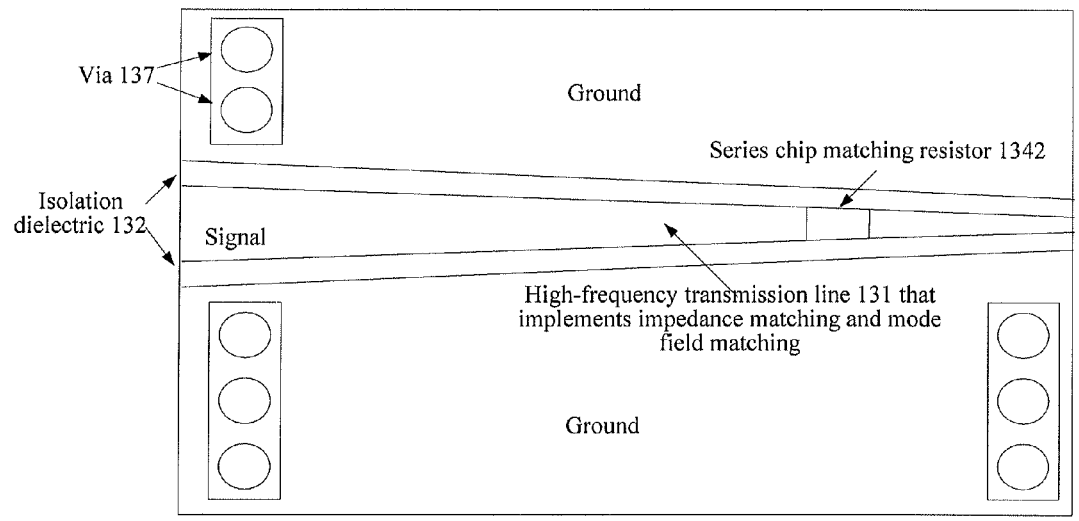
FIG. 6 is a top view of a first side of a connecting plate of another optoelectronic device according to Embodiment 4.

FIG. 6 is a top view of the front side of the connecting plate when the optoelectronic chip 122 is an optoelectronic chip that works at a current such as a current of a directly modulated semiconductor laser. In addition to the preceding via, the first side of the connecting plate includes:

a high-frequency transmission line 131 and an isolation dielectric 132, description of which is the same as that in the optoelectronic chip 122 that works at a voltage, where details are not repeatedly described; and a series chip matching resistor 1342, connected to the high-frequency transmission line 131 in series, and configured to implement impedance matching of the optoelectronic chip 122 when the optoelectronic chip 122 works at a current.

Figure 7:
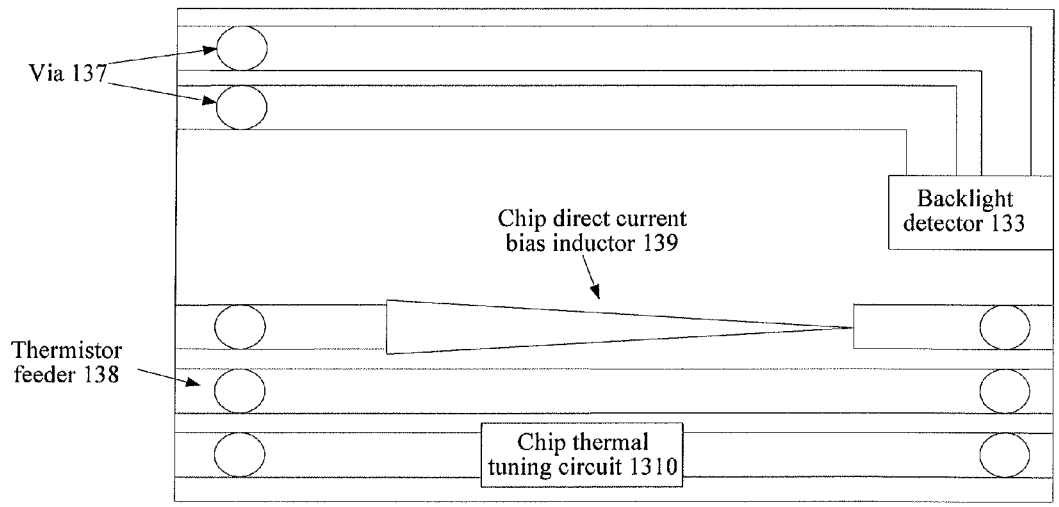
FIG. 7 is a top view of a second side of a connecting plate of an optoelectronic device according to Embodiment 4.

FIG. 7 is a top view of a second side of a connecting plate. In addition to the preceding via 137, the second side of the connecting plate includes:

A low-frequency line is configured to transmit a low-frequency signal.

The low-frequency line includes a thermistor feeder 138. As a part of the low-frequency line, the thermistor feeder 138 is configured to transmit a low-frequency signal of a thermistor 136, that is, to transmit information of a temperature of the optoelectronic chip. Generally, the optoelectronic chip 122 is very sensitive to a temperature. Therefore, a feedback voltage of the thermistor needs to be detected through the thermistor feeder 138, so as to record the temperature or perform feedback control on the temperature.

A backlight detector 133 saves space of an electronic component on the chip subcarrier 121 where the backlight detector is originally located.

Preferably, the second side of the connecting plate may further include:

A chip direct current bias inductor 139 is configured to pass direct current and block alternating current, so as to improve power quality of direct current power supply of the optoelectronic chip 122. In the optoelectronic chip 122 with a direct current bias circuit for power supply in this embodiment, the direct current bias circuit on the back side and the high-frequency transmission line on the front side are connected to a same pole of the optoelectronic chip, alternating current exists in the power supply line. Therefore, the chip direct current bias inductor 139 is set to pass direct current and block alternating current, so as to further reduce the direct current in the power supply line and improve the power quality of the direct current power supply of the optoelectronic chip 122. A major function of the chip direct current bias inductor 139 is to increase a bandwidth and reduce a parasitic capacity.

A chip thermal tuning circuit 1310 is configured to adjust a temperature of the optoelectronic chip 122 into a preset working range according to feedback of the thermistor feeder 138. In this embodiment, a Thermoelectric Cooler (TEC) is used. The thermoelectric cooler is made by using the Peltier effect of semiconductor materials. When a couple is made from direct current semiconductor materials, one end of the couple absorbs heat and the other end discharges heat for the purpose of heating and cooling. This effectively adjusts a current temperature of the optoelectronic chip.

Beneficial effects of the technical solution provided in this embodiment are as follows:

An optoelectronic device is provided in this embodiment. The optoelectronic device is mainly formed by a packaged part 110, a core component 120, and a double-sided connecting plate 130, where the double-sided connecting plate 130 effectively isolates interference between a high-frequency transmission line and a low-frequency line. A high-frequency transmission line 131 and an isolation dielectric 132 that are on a front side of the connecting plate of the double-sided connecting plate form a coplanar waveguide transmission line together with the ground to implement mode field matching during a high-frequency signal transmission process. Impedance matching of the high-frequency transmission line 131 is implemented by changing parameters such as a dielectric thickness of the high-frequency transmission line 131, a dielectric constant of the dielectric, and a dielectric width at various positions. A chip matching resistor 1341 or 1342 is integrated on the first side of the double-sided connecting plate 130 through a chip subcarrier 121, which implements impedance matching of the optoelectronic chip 122 and meanwhile, saves space of lines on the chip subcarrier 121. The preceding mode field matching and impedance matching ensure integrity and efficiency of transmitting a high-frequency signal. A high-frequency response between the optoelectronic chip 122 and the packaged part 110 is improved during a packaging process of the optoelectronic device. A back side of the connecting plate passes a low-frequency signal and direct current, and meanwhile, integrates various components that perform different functions, such as a backlight detector 133, a chip direct current bias inductor 139, and a chip thermal tuning circuit 1310, which further saves space of lines where these components are originally located and extends corresponding functions.

The foregoing description described exemplary embodiments and is not intended to limit the scope of the claims. Any modification, equivalent replacement, or improvement made within the spirit and principle of the claims shall fall within the protection scope of the claims.

What is claimed is:

1. An optoelectronic device comprising:
   a packaged part and a core component, wherein the core component comprises a chip subcarrier and an optoelectronic chip;
   a connecting plate that includes a high-frequency transmission line configured to transmit a high-frequency signal between the packaged part and the core component, wherein the high-frequency transmission line is a transmission line with a shape that tapers from broad to narrow;
   an isolation dielectric located on both sides of the high-frequency transmission line, which is configured to isolate the high-frequency transmission line and ground, wherein the high-frequency transmission line and the isolation dielectric form a coplanar waveguide transmission line together with the ground to implement mode field matching; and
   a low-frequency line configured to transmit a low-frequency signal.

2. The device according to claim 1, wherein the connecting plate further comprises a backlight detector configured to detect a working state of the optoelectronic chip by collecting a backlight signal of the optoelectronic chip, so as to perform feedback control.

3. The device according to claim 1, wherein the connecting plate further comprises a chip matching resistor configured to implement impedance matching of the optoelectronic chip, and that is connected to the high-frequency transmission line in series or parallel.

4. The device according to claim 3, wherein the chip-matching resistor is a parallel chip matching resistor with one end connected to the high-frequency transmission line in parallel through a wire-bonding and the other end connected to the ground that is configured to implement impedance matching of the optoelectronic chip when the optoelectronic chip is a high-impedance voltage-type working device.

5. The device according to claim 3, wherein the chip-matching resistor is a series chip matching resistor connected to the high-frequency transmission line in series and is configured to implement impedance matching of the optoelectronic chip when the optoelectronic chip is a low-impedance current-type working device.

6. The device according to claim 1, wherein the connecting plate is a single-sided connecting plate.

7. The device according to claim 1, wherein:
   the connecting plate is a double-sided connecting plate, and the double-sided connecting plate comprises a via for connecting a high-frequency transmission line or the low-frequency line from one side of the connecting plate to the other side;
   a first side of the connecting plate is connected to the packaged part and the chip subcarrier, and is configured to transmit a high-frequency signal between the packaged part and the chip subcarrier; and
   a second side of the connecting plate is connected to the packaged part and the chip subcarrier, and is configured to transmit a low-frequency signal between the packaged part and the chip subcarrier.

8. The device according to claim 7, wherein:
   the first side of the connecting plate comprises a high-frequency transmission line and an isolation dielectric; and
   the second side of the connecting plate comprises a backlight detector and a low-frequency line.

9. The device according to claim 8, wherein the second side of the connecting plate further comprises a chip direct current bias inductor configured to pass direct current and block alternating current to improve power quality of direct current power supply of the optoelectronic chip.

10. The device according to claim 8, wherein the second side of the connecting plate further comprises:
   a thermistor feeder configured to detect a feedback voltage of a thermistor; and
   a chip thermal tuning circuit configured to adjust a temperature of the optoelectronic chip into a preset working range according to voltage feedback of the thermistor.

\* \* \* \* \*